(12) United States Patent
Cao

(10) Patent No.: US 10,120,961 B2
(45) Date of Patent: *Nov. 6, 2018

(54) METHOD FOR IMMEDIATE BOOLEAN OPERATIONS USING GEOMETRIC FACETS

(71) Applicant: Shangwen Cao, Montreal (CA)

(72) Inventor: Shangwen Cao, Montreal (CA)

(73) Assignee: Nature Simulation Systems Inc., Montreal, Quebec (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/840,052

(22) Filed: Dec. 13, 2017

(65) Prior Publication Data

US 2018/0113958 A1    Apr. 26, 2018

Related U.S. Application Data

(63) Continuation-in-part of application No. 15/207,927, filed on Jul. 12, 2016.

(51) Int. Cl.

| G06F 17/50 | (2006.01) |
|---|---|
| G06T 17/10 | (2006.01) |
| G06F 17/10 | (2006.01) |
| G06T 17/20 | (2006.01) |
| G06F 9/30 | (2018.01) |

(52) U.S. Cl.
CPC .......... *G06F 17/50* (2013.01); *G06F 9/30029* (2013.01); *G06F 17/10* (2013.01); *G06T 17/10* (2013.01); *G06T 17/20* (2013.01); *G06T 2210/21* (2013.01)

(58) Field of Classification Search
CPC ....................................................... G06F 17/50
USPC ........................................................ 345/420
See application file for complete search history.

(56) References Cited

U.S. PATENT DOCUMENTS

| 5,825,369 | A | * | 10/1998 | Rossignac | ................ | G06T 9/40 |
|---|---|---|---|---|---|---|
| | | | | | | 345/440 |
| 5,886,702 | A | * | 3/1999 | Migdal | ................... | G06T 17/20 |
| | | | | | | 345/423 |
| 5,905,507 | A | * | 5/1999 | Rossignac | ................ | G06T 9/40 |
| | | | | | | 345/440 |
| 5,929,860 | A | * | 7/1999 | Hoppe | ................... | G06T 17/20 |
| | | | | | | 345/419 |

(Continued)

OTHER PUBLICATIONS

Landier, "Boolean operations on arbitrary polyhedral meshes", 24th International Meshing Roundtable (IMR24), 2015.

(Continued)

*Primary Examiner* — Jason C Olson

(57) ABSTRACT

A method for performing Boolean operations using a computer to create geometric models from primary geometric objects and their facets, comprises mapping rendering facets to extended triangles that contain neighbors; building intersection lines, splitting each triangle through which an intersection line passes, determining each facet is visible or obscure, and regrouping the facets to form one or more geometric objects. This method does not utilize the most popular data structures CSG and B-REP in CAD/CG/Solid Modeling systems, but has the advantages of both CSG and B-REP: easy to implement and flexible. Additionally it is a united method for solid modeling and surface modeling systems, and it is able to generate variant and editable models.

20 Claims, 6 Drawing Sheets

(56) References Cited

U.S. PATENT DOCUMENTS

| | | | | |
|---|---|---|---|---|
| 5,945,996 | A * | 8/1999 | Migdal | G06T 17/20 345/420 |
| 5,977,987 | A * | 11/1999 | Duluk, Jr. | G06T 15/10 345/441 |
| 6,016,153 | A * | 1/2000 | Gueziec | G06T 9/40 345/441 |
| 6,031,548 | A * | 2/2000 | Gueziec | G06T 17/20 345/440 |
| 6,078,331 | A * | 6/2000 | Pulli | G06T 17/20 345/423 |
| 6,172,679 | B1 * | 1/2001 | Lim | G06T 15/40 345/421 |
| 6,191,787 | B1 * | 2/2001 | Lu | G06T 17/05 345/418 |
| 6,307,555 | B1 * | 10/2001 | Lee | G06T 17/20 345/421 |
| 6,573,895 | B1 * | 6/2003 | Carter | G06T 15/40 345/423 |
| 6,587,105 | B1 * | 7/2003 | Stam | G06T 17/20 345/423 |
| 6,850,638 | B1 * | 2/2005 | Lounsbery | G06T 17/205 345/420 |
| 6,989,830 | B2 * | 1/2006 | Stollnitz | G06T 17/20 345/420 |
| 7,127,380 | B1 * | 10/2006 | Iverson | G06F 17/5018 703/2 |
| 7,133,043 | B1 * | 11/2006 | Hollasch | G06T 15/06 345/421 |
| 7,209,137 | B2 * | 4/2007 | Brokenshire | G06T 15/00 345/420 |
| 7,324,105 | B1 * | 1/2008 | Moreton | G06T 17/20 345/420 |
| 7,366,581 | B2 * | 4/2008 | Hill | G06T 17/10 700/118 |
| 7,408,553 | B1 * | 8/2008 | Toksvig | G06T 11/40 345/423 |
| 7,589,720 | B2 * | 9/2009 | Zhou | G06T 17/20 345/419 |
| 8,345,042 | B2 * | 1/2013 | Kataoka | G06K 9/00214 345/420 |
| 8,547,395 | B1 * | 10/2013 | Hutchins | G06T 11/40 345/611 |
| 9,401,046 | B2 * | 7/2016 | Munkberg | G06T 17/205 |
| 9,721,363 | B2 * | 8/2017 | Williams | G06T 11/203 |

OTHER PUBLICATIONS

Rappoport et al, "Interactive Boolean Operations for Conceptual Design of 3-D Solids", Institute of Computer Sciences, The Hebrew University, 1997.

E. Gursoz et al.,"Non-Regularized Boolean Set Operations on Non-Manifold B-Representation Objects", Computer-Aided Design 23 (1991) Jan./Feb. No. 1 London, GB.

D.F. Watson, "Computing the n-dimensional Delaunay tessellation with application to Voronoi polytopes", The Computer Journal 24 (2) 1981.

* cited by examiner

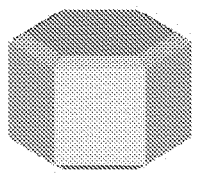
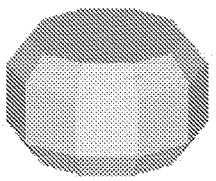
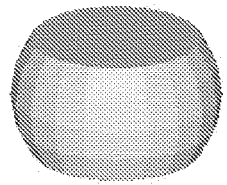
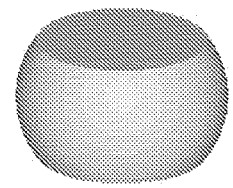
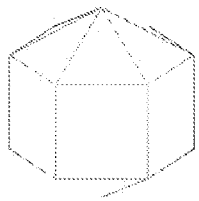
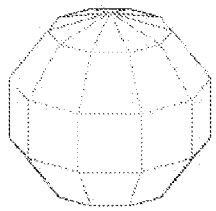
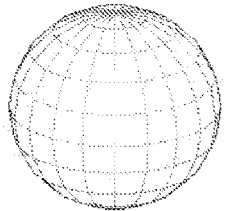
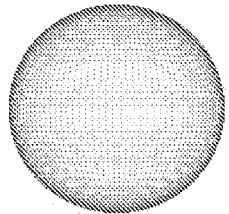
FIG. 3A Prior Art    FIG. 3B Prior Art    FIG. 3C Prior Art    FIG. 3D Prior Art
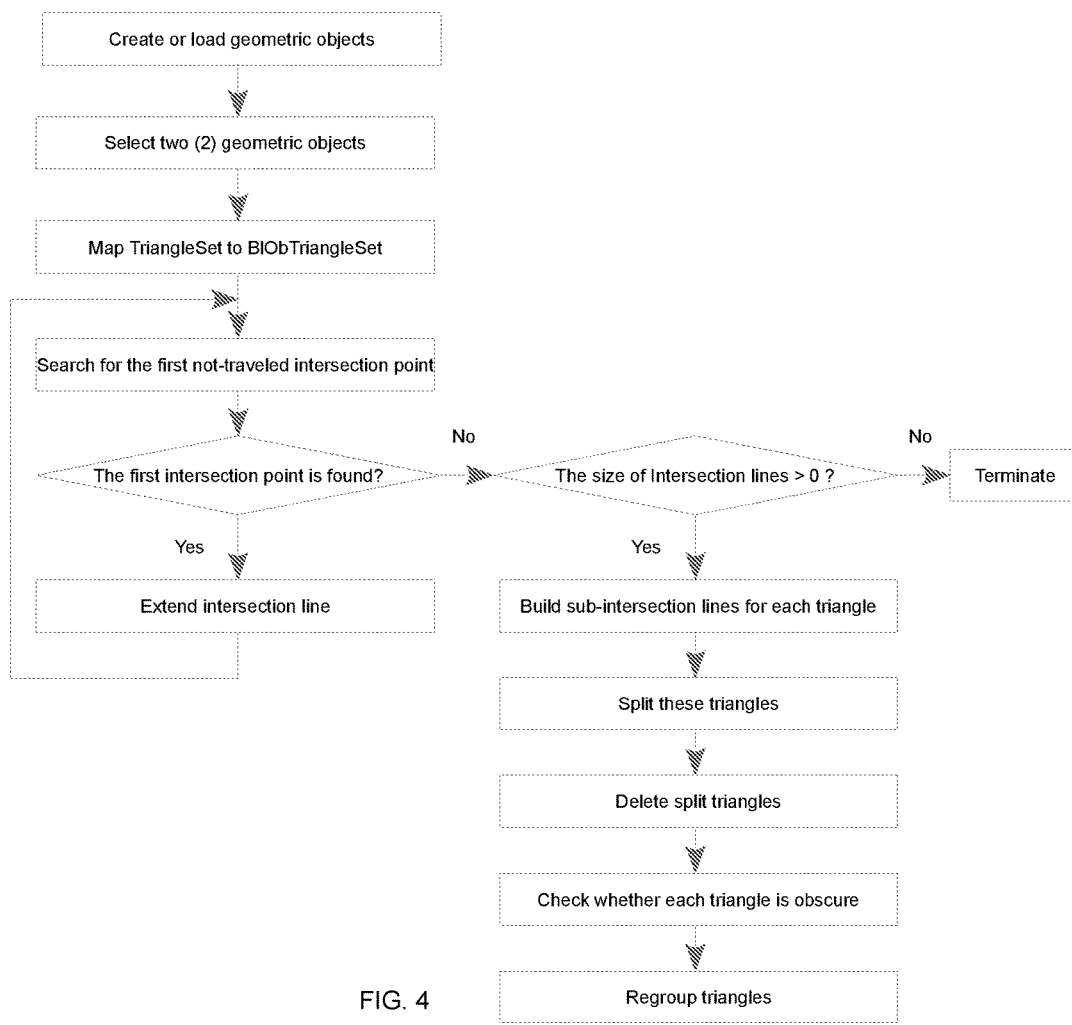
FIG. 4

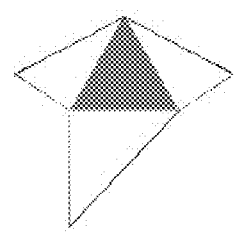
FIG. 5
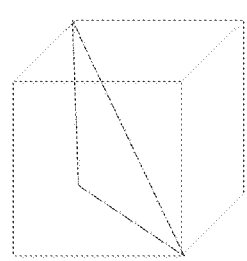 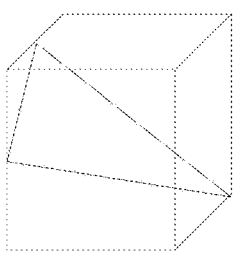
FIG. 6A
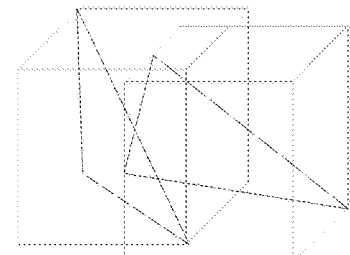
FIG. 6B
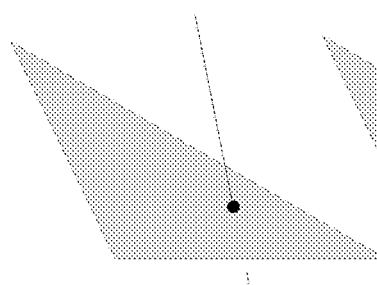 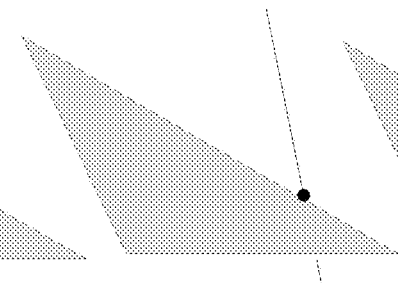 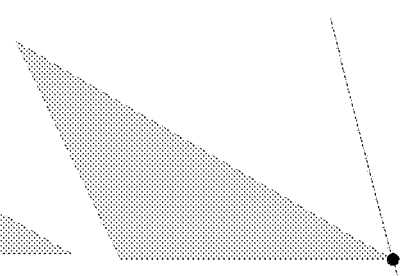
FIG. 7A　　　　　FIG. 7B　　　　　FIG. 7C
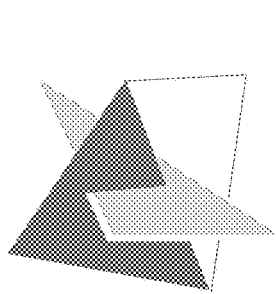 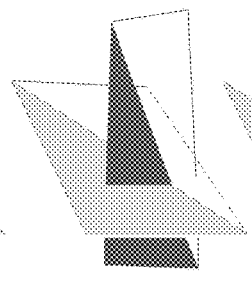 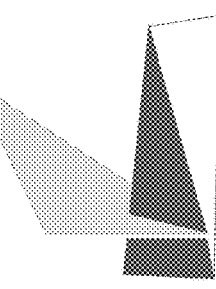 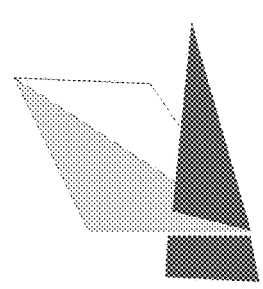
FIG. 8A　　　FIG. 8B　　　FIG. 8C　　　FIG. 8D

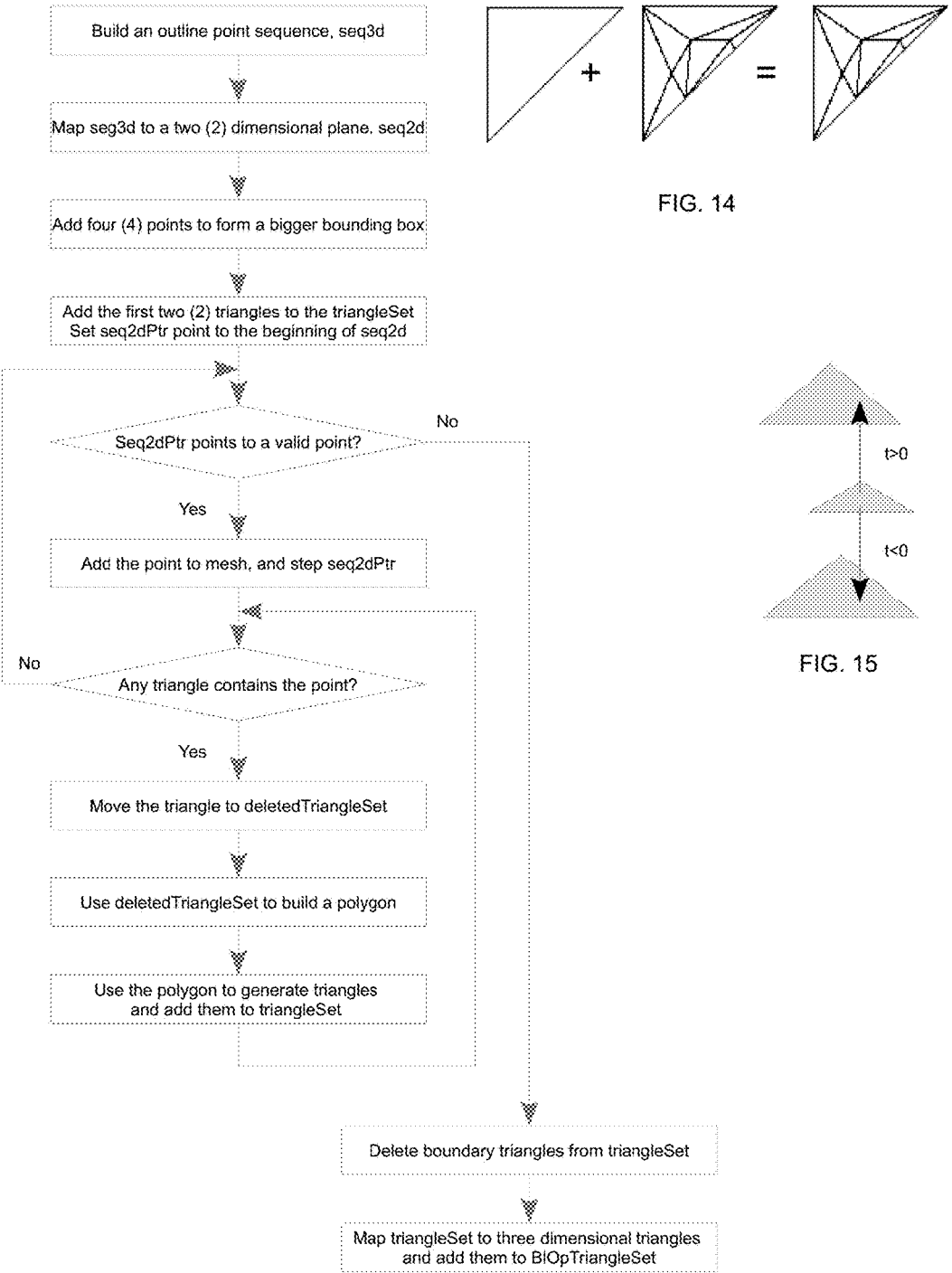
FIG. 13 Prior Art except the first two (2) steps, the last one, and the condition Any triangle contains the point.

METHOD FOR IMMEDIATE BOOLEAN OPERATIONS USING GEOMETRIC FACETS

BACKGROUND

Field of the Invention

This invention provides an immediate Boolean operation method for building three (3) dimensional geometric models from primary geometric objects to Computer Aided Design, Computer Graphics, Solid Modeling systems, and Surface Modeling systems, which are widely used in product design, manufacturing, and simulation. Mechanic industry, culture and sports, everywhere there are geometric shapes, may have CAD/CG applications.

Related Art

Computer hardware is so highly developed that even an ordinary Personal Computer may be used to install and run a commercial CAD/CG system, which normally has Boolean operation functions including AND, OR, and NOT. PC components comprise input devices, such as a mouse and a keyboard, a main machine, a screen, and a printer. The software system contains geometric and non geometric functions. FIG. 1 shows the main PC components and FIGS. 2A through 2D depict a typical CAD/CG software system architecture.

Boolean operations provide a general process of building complex solid geometric objects from different geometric shapes, which include primary geometric objects, swept or extruded objects, to CAD/CG/Solid Modeling systems. Lee applied Boolean operations to divide surface [Lee U.S. Pat. No. 6,307,555].

Boolean operations may rely on Constructive Solid Geometry, CSG, to record primary geometric objects and operation sequence in a hierarchic way, which technically is easy to implement, whereas Boundary Representation, B-REP, is regarded as a more flexible way that supports more geometric object types like extended geometries [Gursoz, 1990].

This invention presents five (5) Boolean operation commands: combination, intersection, exclusion, difference, and division, which directly work on triangles decomposed from geometric facets used for rendering functions and do not require the data structure Constructive Solid Geometry or Boundary Representation. The data structures defined in this invention are a few of simple classes, the algorithms incorporated in this invention are concise and easy to implement, and the five (5) commands allow the user to create geometric models not only by selecting the types of geometric objects but also by defining their facets. FIG. 3 presents that a box with 6 facets and a sphere with different facets make distinct results.

Although the five (5) commands are designed for solid modeling and surface modeling, surface trimming command is incorporated in this invention provides an alternative for surface modeling and it identifies whether a facet is obscure in a different way.

This invention presents data structures and algorithms differ from CSG and B-REP, and the algorithms incorporated in this invention include triangle-triangle intersections, splitting triangles with sub-intersection lines, identifying whether a facet is obscure, and regrouping triangles to form geometric models.

DISCLOSURE OF THE INVENTION

This invention provides a set of data structures and algorithms for performing Boolean operations, which are used to build complex geometric models and work directly on triangles decomposed from geometric facets used as rendering data by computer hardware and rendering functions like OpenGL libraries. A geometric shape, for example, a sphere, a cone, a cylinder, a box, triangular facets, an extruded or swept object, and a surface patch, is triangulated to build a set, noted as TriangleSet, for displaying. When two geometric shapes are selected for performing a Boolean operation, neighboring triangles will be added to each triangle in TriangleSet to form another set for each of the shapes, BIOpTriangleSet.

The second step of a Boolean operation this invention described is to search and build intersection lines between triangle sets. It starts with finding the first pair of intersecting triangles: this system builds an axis aligned minimum bounding box for each triangle and checks whether two bounding boxes overlap to decide if edge-triangle intersection needs to be calculated. Once the edge-triangle intersection point(s) falls inside a triangle, this system completes the searching task and stores the point data into an intersection line set.

To extend the current intersection line, this method traces neighboring triangles and calculates edge-triangle intersection points until the intersection line becomes closed.

The third step of a Boolean operation this invention described is to split triangles. Each segment of the intersection lines references two (2) triangles, each of the triangles has at least one sub-intersection line that contains one or more segments, which divide a triangle into three (3) or more smaller triangles. After splitting the triangles, the original triangles are removed, and those smaller triangles are added to the BIOpTriangleSet.

The fourth step of a Boolean operation this invention described is to decide each triangle is obscure or visible. If a triangle is enclosed by other triangles, it is obscure. A triangle is visible means it is outside another object.

The fifth step of a Boolean operation this invention described is to regroup the triangles: some of them have to be removed and some need to be put together, and there are five (5) cases for regrouping.

The final step of a Boolean operation this invention described is to map BIOpTriangleSet to TriangleSet.

The process of the said surface trimming command contains six (6) steps, too. Initially, this system maps a surface to a BIOpTriangleSet and one of its trimming contours to an extruded shape to form a BIOpTriangleSet. Step two (2), three (3), and six (6) are the same as that of the Boolean operations. Step four (4) checks a triangle is to the left or right side of the trimming contour to decide whether it is necessary to be reserved. The regrouping function, step five (5), deletes only left side or right side triangles when the system trims a surface.

BRIEF DESCRIPTION OF THE DRAWINGS

FIG. 3 represents that distinct facets make various results even their original geometric object types and sizes are the same: the left side example has less facets and the right side has more facets. In these examples, Boolean intersection operations work on a box and a sphere.

FIG. 4 is a flowchart for immediate Boolean operations using geometric facets.

FIG. 5 depicts that a triangle has three (3) neighbors. Given a triangle and its two vertices, there is one and only one neighboring triangle in solid models.

FIGS. 6A and 6B show two minimum bounding boxes do not overlap and two boxes overlap each other. Each triangle virtually has a minimum bounding box. If two boxes do not overlap, the triangles contained in the two boxes do not intersect. If the boxes overlap, edge-triangle intersection calculation is required.

FIGS. 7A through 7C depict three (3) edge-triangle intersection cases: an intersection point falls inside a triangle, an intersection point locates on an edge of a triangle, an intersection point is a vertex of a triangle.

FIGS. 8A through 8D show the searching candidate set, which allows the system to traverse next triangle for extending intersection lines by conducting edge-triangle calculation. Triangles filled with colors are the last pair of triangles that intersect each other, the triangles not filled are referenced by the member m_NeigTri of the data structure Triangle3dEx, which guides the system searching a minimum set of triangles when building intersection lines. The set contains one triangle, two triangles, or zero.

FIG. 10A has one (1) sub-intersection line, 10B two (2), and 10C one (1).

FIG. 13 is the flowchart of Delaunay mesh modified Watson method that created the sequence of FIGS. 12A through 12H.

FIG. 14 shows a triangle and its Delaunay mesh. The original triangle is removed and only the Delaunay mesh is reserved for late computations.

FIG. 15 shows t-Buffer where t may be negative and positive. If the size of negative t and positive t is balanced in t-Buffer, the triangle concerned is enclosed by another object and is obscure.

DETAILED DESCRIPTION

Figure 1:
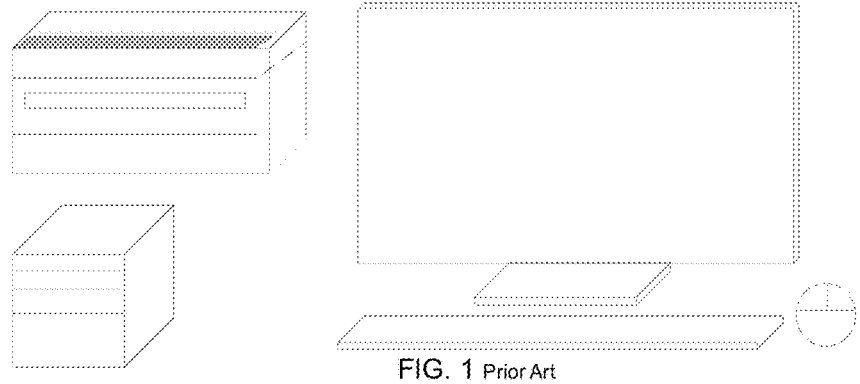
FIG. 1 shows the main personal computer components, which generally contain a main machine, input devices including mouse and keyboard, a display, and a printer. A highly developed CAD/CG system can run on a PC machine.
Figure 2A:
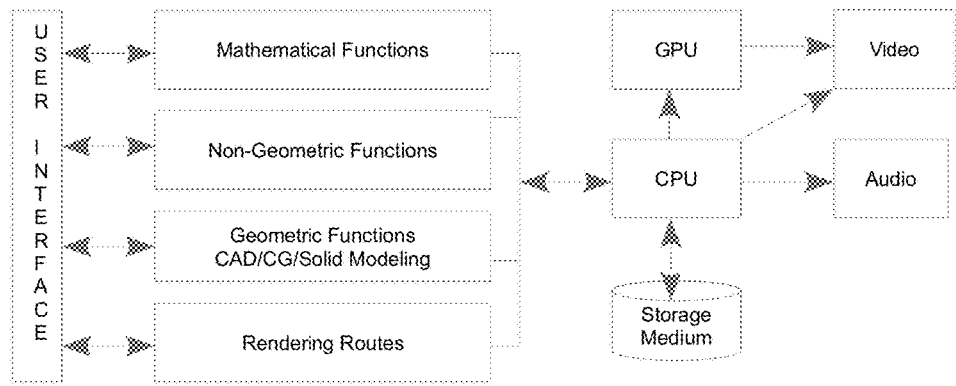
FIGS. 2A through 2D describe a software architecture in which a CAD/CG/Geometric Modeling system uses Boolean operations and surface trimming to build geometric models.
Figure 2B:
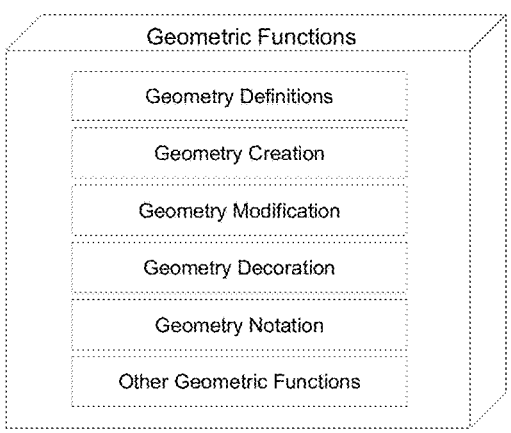
Figure 2C:
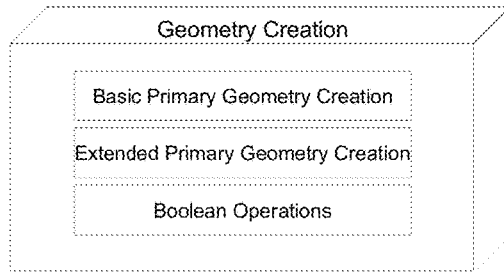
Figure 2D:
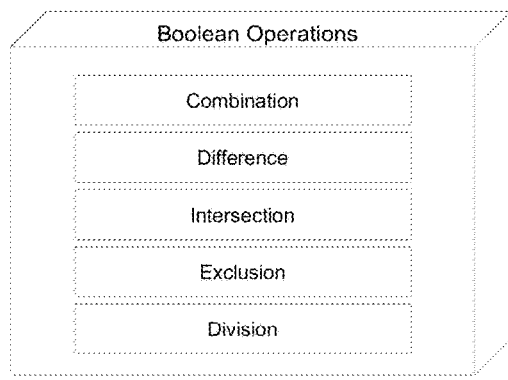
Figure 9A:
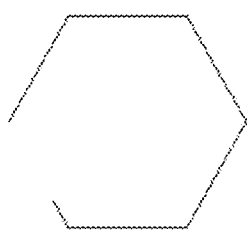
FIGS. 9A through 9D show four (4) examples of intersection lines. A box intersects a sphere, which has different facet numbers.
Figure 9B:
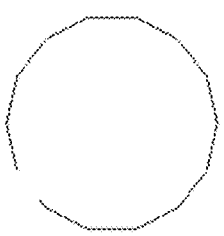
Figure 9C:
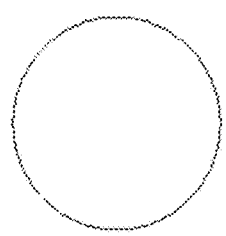
Figure 9D:
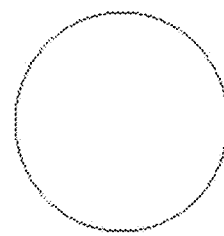

This invention defines these data structures: Point3dEx, Triangle3dEx, and BIOpTriangle3dSet that inherit Point3d, Triangle3d, Triangle3dSet storing facets for rendering geometric objects. When performing a Boolean operation, the system maps rendering facets to BIOpTriangle3dSet and all following processes focus on the members and attributes of BIOpTriangle3dSet. FIG. 4 is the flowchart describing the main procedure of Boolean operations conducted by the present invention. After a Boolean operation is completed, the system maps the resultant stored in BIOpTriangle3dSet to rendering facets.

Geometric Facets for Rendering

CAD systems render facets to represent a geometric object, such as a sphere, a cone, a box, a cylinder, an extruded or swept object. A facet may compose three (3) or more points, and facets are usually decomposed into triangles for easy calculations. A box has six (6) facets decomposed into twelve (12) triangles. A sphere may have eighteen (18) facets, composing twenty four (24) triangles. A sphere may also be rendered using more than one thousand (1,000) facets and triangles. FIG. 3 shows a sphere rendered with different facets. This method uses Triangle3dSet to note triangle set data structure for rendering a geometric object, it contains two (2) attributes: a three (3) dimensional point set and a triangle set, where Triangle3d references Point3d.

```
class Triangle3dSet
{
    DataSet<Point3d>    m_PointSet;
    DataSet<Triangle3d> m_TriangleSet;
};
class Triangle3d
{
    Point3d        *m_Points[3];
};
class Point3d
{
    DataTypeI m_X, m_Y, m_Z;
};
```

Triangles for Boolean Operations

The Boolean Operation method described in this invention defined three (3) key classes: BIOpTriangleSet, Triangle3dEx, and Point3dEx.

```
class BIOpTriangleSet
{
    DataSet<Point3dEx>      m_PointSet;
    DataSet<Triangle3dEx>   m_TriangleSet;
};
class Point3dEx : Point3d
{
    DataTypeII     m_ID; // position and sequence index
    DataTypeIII    m_X, m_Y, m_Z; // DataType III may
                   be different from DataTypeI
};
class Triangle3dEx : Triangle3d
{
    Point3dEx      *m_Points[3];
    DataTypeII     m_ID;
    Plane          m_Plane;
    DataTypeIV     m_Normal[3];
    Triangle3dEx   *m_NeigTri[3]; // neighboring triangles
};
```

DataTypeII may be int, long, unsigned long, or other integer types. DataTypeIII is a floating point data type, such as float, double, even long double.

The class Triangle3dEx specifies each triangle may have three (3) neighboring triangles, and every triangle is stored just one (1) copy in BIOpTriangleSet. Given the box example, the simplest way it has twelve (12) triangles, even each of them has three (3) neighbors, BIOpTriangleSet still stores a total of twelve (12) triangles.

Technically Triangle3d may have the attribute m_Normal. If DataTypeI and DataTypeIV are the same type, for example, double, the attribute m_Normal can be inherited.

Data Mapping

The process of mapping Triangle3dSet to BIOpTriangleSet copies point set and triangle set from rendering statue and fills default attributes. Data mapping contains the following procedure:
1) Copy points from Triangle3dSet to BIOpTriangleSet and ensure there are not identical points.
2) Copy triangles from Triangle3dSet to BIOpTriangleSet.
3) For each triangle in BIOpTriangleSet, set its neighboring triangles.
4) Calculate the normal and build the plane equation for each triangle in BIOpTriangleSet.

Remark 1: Given two (2) points a and b, if $|x_a-x_b|<\varepsilon$ and $|y_a-y_b|<\varepsilon$ and $z_a-z_b|<\varepsilon$, where $\varepsilon$ is a positive floating point number, for example 5.0e-16, then b is identical to a.

Remark 2: When mapping points from rendering data to BIOpTriangleSet, the system checks if there is an identical point in BIOpTriangleSet.

Remark 3: A triangle, which has three (3) points, defines a plane whose mathematical formula is $ax+by+cz+d=0$ and the class Plane internally records it as an array of four (4) numbers, such as double m_ABCD[4].

Remark 4: A triangle, if its three (3) points are not identical, always has a valid normal. Even it is related to m_ABCD, a separate copy makes things more clear and easy to handle later.

Remark 5: Every triangle has three (3) edges, when there are no duplicated points, it has three (3) neighboring triangles in solid models. FIG. 5 shows an example: a triangle filled with dark color and its three (3) neighbors. When concerning a surface patch for surface trimming, one or two neighbors of a triangle may be null.

The First Intersection Point

Every triangle has three (3) vertices, which define a minimum bounding box. This method adopted the concept of axis aligned minimum bounding box.

Given a pair of triangles, if their bounding boxes do not overlap, the two triangles have no intersection point; otherwise, this method carries out edge-triangle intersection calculation.

If an edge of a triangle $T_a$ intersects with a plane defined by a triangle $T_b$ and the intersection point pet falls inside $T_b$, then pet is the first intersection point. If pet is outside of $T_b$, then switch the triangle position in the pair, $(T_a, T_b)$ changed to $(T_b, T_a)$, and conduct edge-triangle intersection calculation.

Given the i-th edge of a triangle $T_a$, $i \in [0, 2]$, its formula is: $p=p_i+t*(p_{(i+1)\%3}-p_i)$, and the plane defined by the triangle $T_b$, its formula is: $ax+by+cz+d=0$. If the two formulas have a solution, the edge intersects with the plane. If the edge-plane intersection point falls inside the triangle $T_b$, then the point is the edge-triangle intersection point.

Extending an Intersection Line

This method defines a data structure for recording an intersection point as PntEgTri:

```
class PntEgTri
{
    Triangle3dEx    *m_Tri0, *m_Tri1;
    DataTypeII      m_EdgeIndex;
    DataTypeII      m_PointPosi;
    Point3dEx       m_Point;
    Point3dEx       *m_PntGlobalIndexA, *m_PntGlobalIndexB;
};
```

According to the location of an intersection point on a triangle, a PntEgTri, simply said pet, can be classified into three (3) categories shown in FIGS. 7A through 7C.
1) The most popular case is the edge-triangle intersection, pet locates on an edge of triangle $T_a$ and inside triangle $T_b$.
2) Edge-edge intersection, pet locates on an edge of triangle $T_a$ and on an edge of triangle $T_b$.
3) Edge-vertex intersection, pet locates on an edge of triangle $T_a$ and on a vertex of triangle $T_b$.

To extend an intersection line, this system catches next neighboring triangle(s) and checks edge-triangle intersection until the intersection line gets closed or all triangles are traversed.

Sub-Intersection Line

Figure 10A:
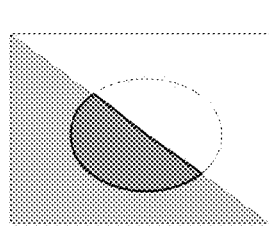
FIGS. 10A through 10C give three (3) examples of sub-intersection lines in darker color.
Figure 10B:
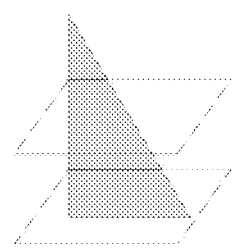
Figure 10C:
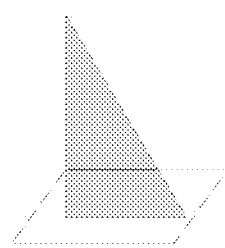
Figure 11A:
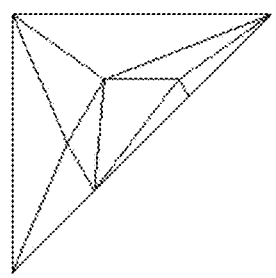
FIGS. 11A through 11D show four (4) examples that sub-intersection lines divided a triangle into a set of triangles.
Figure 11B:
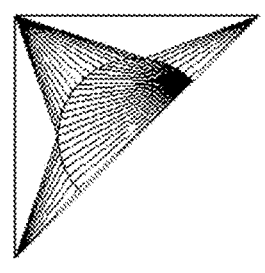
Figure 11C:
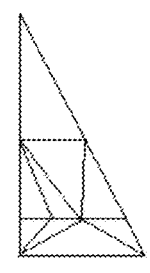
Figure 11D:
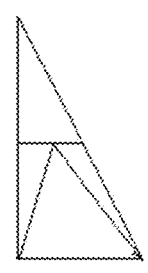
Figure 12A:
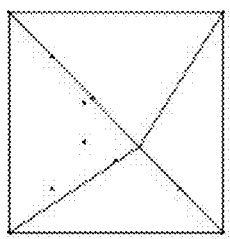
FIGS. 12A through 12H show a Delaunay mesh sequence in which each intersection point is inserted into the mesh step by step.
Figure 12B:
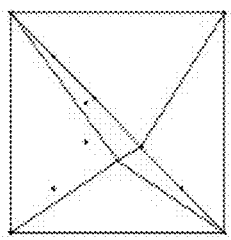
Figure 12C:
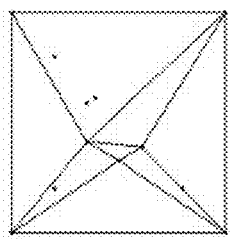
Figure 12D:
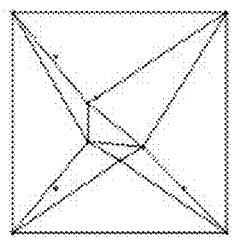
Figure 12E:
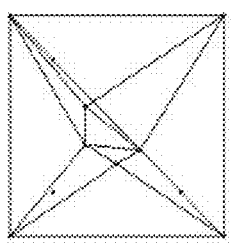
Figure 12F:
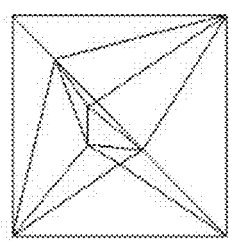
Figure 12G:
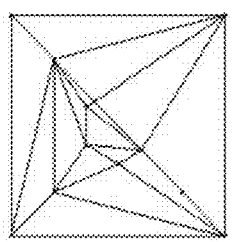
Figure 12H:
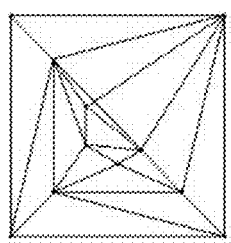
Figure 16A:
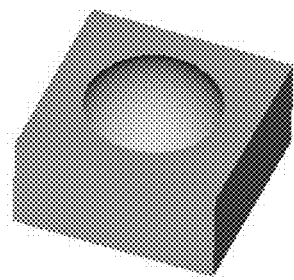
FIGS. 16A through 16E show five (5) examples of Boolean operations conducted with a box and a sphere.
Figure 16F:
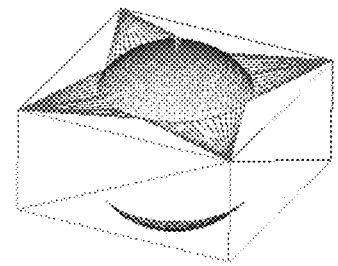
FIGS. 16F and 16G depict the internal mesh of two Boolean operation resultants: combination and exclusion.
Figure 16B:
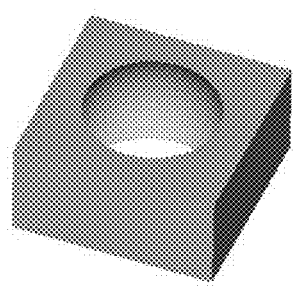
Figure 16G:
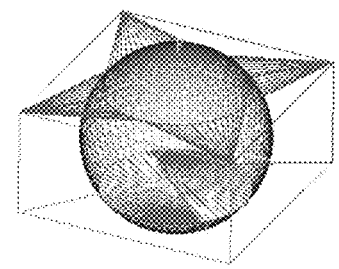
Figure 16C:
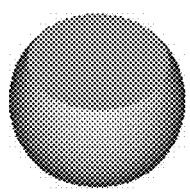
Figure 17:
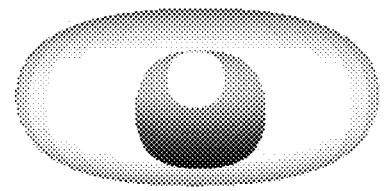
FIG. 17 shows a contour line trims a closed surface, a deformed sphere, and generates two (2) holes.
Figure 16D:
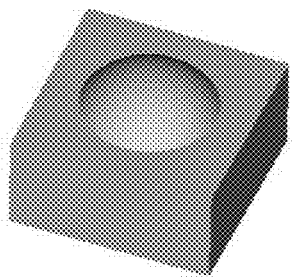
Figure 18:
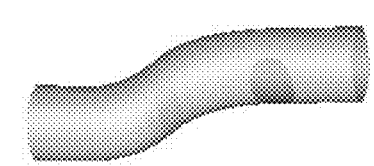
FIG. 18 gives an example in which an extruded surface, a tube, is trimmed by a contour line and creates a hole.
Figure 16E:
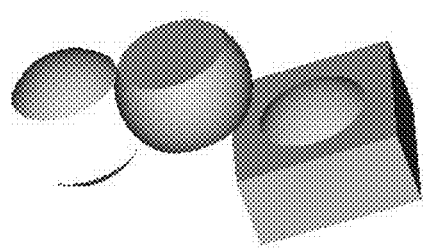

An intersection line passes through a set of triangles and divides each triangle into multi partitions. The segments of an intersection line inside a triangle make up a sub-intersection line. FIGS. 10A through 10C show three (3) examples in which the dark lines are sub-intersection lines. In practice, a triangle may have zero (0), one (1), two (2) or three (3) sub-intersection lines.

The following algorithm shows how to get a valid reference to a triangle that has at least one sub-intersection line:

```
for each intersection line
    for each intersection point, get the triangle references: (m_Tri0, m_Tri1)
        for each triangle of the triangle pair, if it is not split
            for each intersection line
                search and build a sub-intersection line
```

Given a valid triangle and an intersection line, to decide if a pet belongs to the sub-intersection line of the triangle, this method checks whether
1) pet is on an edge of the triangle,
2) or pet is inside the triangle,
3) or pet equals a vertex of the triangle.

Splitting a Triangle

Given a set of sub-intersection lines, to split a triangle, this method
1) Removes duplicated pets. If neighboring pets are identical, this method reserves just one copy.
2) Identifies the position of end pets: checks each pet locates on which edge of the triangle.
3) Splits the upper partition, down partition, and middle partition of the triangle where applicable.

Given a set of points on a plane that represents a partition of a triangle, to decompose the plane into a group of triangles, this invention modified Delaunay 2D mesh Watson method, which is published in 1981 [Watson, 1981].

A Delaunay 2D mesh has three (3) data sets: triangle set that holds the generated triangles, deleted triangle set that stores just deleted triangles, and polygon that records the outline of deleted triangle set.

The modified Delaunay 2D mesh method contains the following steps:
1) Build an outline point sequence that links sub-intersection lines and vertices of the triangle where applicable.
2) Map the three (3) dimensional point sequence to two (2) dimensional points according to the aspect of the plane.
3) Add four (4) points to form a bigger bounding box that encloses all the two (2) dimensional points.
4) Assume that one dialog line of the bounding box splits the box into two (2) triangles and add them into the triangle set.
5) Insert every point except bounding ones into the triangle set.
   a) For each point, check every triangle in the triangle set whether its circumcircle contains the point or the last segment passes through the triangle. If the condition is met, erase it from the triangle set and add it to the deleted triangle set.
   b) Use the deleted triangle set to extend the polygon and clear the deleted triangle set immediately.
   c) Use the polygon to generate triangles and add them to the triangle set.
6) Delete boundary triangles from the triangle set.
7) Map the triangle set to three dimensional triangles and add them to BIOpTriangleSet.

FIGS. 12A through 12H show a Delaunay 2D mesh sequence.

Deleting Split Triangles

In the above step, a split triangle got a mark. After all triangles have been traversed, this method deletes the marked triangles. FIG. 14 shows a deletion result.

Obscure Facets

Given two sets of triangles A and B, if A bounds a triangle of B, $T_b$, then $T_b$ is obscure; if B bounds a triangle of A, $T_a$, then $T_a$ is obscure.

To check whether a triangle T is bounded by an object O, this invention uses the following steps.
1) Calculate the centroid, c, of the triangle T
2) Build a line l: p=c+t*N, which starts from the centroid and passes along the normal N of the triangle T
3) For each triangle $T_o$ of the object O, calculate line-plane intersection point. If there is a valid intersection point pet that falls inside the triangle $T_o$, then calculate t that is determined by centroid c and the pet, and add t to a depth buffer, butterT.
4) Check the size of negative t and positive t stored in butterT. If the two sizes are equal, then the triangle T is bounded and obscure.

When performing surface trimming, this system calls the followings procedure to determine whether a triangle is obscure.
1) Set the member m_ID of each Point3dEx of BIOpTriangleSet of the concerned surface patch to be 0.
2) Mark m_ID of Point3dEx of the intersection lines of the said patch in ascending or descending order, which is depending on whether the said line and trimming contour are in the same direction, for example, both of them are counterclockwise.
3) According to m_ID of the member m_Points of each triangle, decide whether it is a boundary triangle.
4) For each boundary triangle, decide it is to the left or right side of the trimming contour, and set its neighbors that are not boundary ones to be left or right.

Regrouping the Facets

This invention states five (5) kinds of Boolean operations, each of them has a different regrouping procedure.

The combination operation, logically it is OR, combines two solid geometric objects and generates a new object, which normally discards obscure partitions and reserves visible ones viewing from outside, has the following procedure.
1) Delete obscure triangles of object A.
2) Delete obscure triangles of object B.
3) Merge the triangles of object A and B.

The intersection operation, logically it is AND, which creates a solid geometric object using public sections of two geometric objects and discards any partitions of A and B outside the shared public sections, has the following procedure.
1) Delete NOT obscure triangles of object A.
2) Delete NOT obscure triangles of object B.
3) Merge the triangles of object A and B.

The exclusion operation, which builds a solid geometric object by removing public sections of two geometric objects and keeping not shared partitions, has the following procedure.
1) Copy object A's obscure triangles to a buffer, bufferA.
2) Delete obscure triangles from object A.
3) Copy object B's obscure triangles to object A.
4) Delete obscure triangles from object B.
5) Copy the triangles in bufferA to object B.
6) Reverse the normal of every obscure triangle of A and B.
7) Merge the triangles of the two objects.

The difference operation, which cuts geometric object A with another object B by removing any partitions of A inside B, has the following procedure.
1) Delete obscure triangles of object A.
2) Delete NOT obscure triangles of object B.
3) Reverse the normal of every triangle of object B.
4) Merge triangles of object A and B.

The division operation, which divides two solid geometric object A and B into three (3) objects, public sections of the two geometric objects, the NOT shared partitions of A and partitions of B, has the following procedure.
1) Copy object A's obscure triangles to a buffer, bufferA.
2) Copy object B's obscure triangles to bufferA.
3) Copy object A's obscure triangles to another buffer, bufferB.
4) Delete object A's obscure triangles.
5) Copy object B's obscure triangles to object A.
6) Delete object B's obscure triangles.
7) Copy object A's obscure triangles stored in bufferA to object B.
8) Reverse the normal of every obscure triangles of A and B.

Mapping to Rendering Facets

Once a Boolean operation is finished, this method maps BIOpTriangleSet to rendering triangles.
1) Each Point3dEx of BIOpTriangleSet is mapped to a Point3d of TriangleSet;

2) Each Triangle3dEx of BIOpTriangleSet is mapped to a Triangle3d of TriangleSet.

U.S. Patent Documents

U.S. Pat. No. 6,307,555 October 2001, Lee, 345/423.

Other Publications

"Non-Regularlized Boolean Set Operations on Non-Manifold B-Rep Objects", E. Gursoz et al., Carnegie Mellon University, Technical Report, 1990.
"Computing the n-dimensional Delaunay tessellation with application to Voronoi polytopes", D. F. Watson, The Computer Journal 24 (2) 1981.

What is claimed:

1. A method that performs immediate Boolean operations using geometric facets of geometric objects implemented in a computer system and operating with a computer, the method comprising:
   mapping rendering facets to extended triangles that contain neighbors;
   building intersection lines starting with and ending with searching for the first pair of triangles that hold a start point of an intersection line by detecting whether two minimum bounding boxes overlap and performing edge-triangle intersection calculations for locating an intersection point, then searching neighboring triangles of the last triangle pair that holds the last intersection point to extend the intersection line until the first intersection point is identical to the last intersection point of the intersection line ensuring that the intersection line gets closed or until all triangles are traversed;
   splitting each triangle through which an intersection line passes using modified Watson method, wherein the modified Watson method includes removing duplicate intersection points, identifying positions of end intersection points, and splitting portion of each triangle including an upper portion, a lower portion, and a middle portion;
   checking each triangle whether it is obscure or visible for Boolean operations or for surface trimming;
   regrouping facets in separate steps that includes copying triangles, deleting triangles, reversing the normal of each triangle of a geometric object, and merging reserved triangles to form one or more new extended triangle sets; and
   mapping extended triangles to rendering facets.

2. The method of claim 1 wherein any Boolean operations, that use rendering facets of the geometric objects to create new geometric objects, including combination, intersection, exclusion, difference, and division, map rendering facets to extended triangles, build intersection lines, split each triangle through which an intersection line passes, check each triangle whether it is obscure or visible, regroup facets to form new extended triangle sets, and map extended triangles to rendering facets at the end of a Boolean operation or surface trimming without the data structure Constructive Solid Geometry and Boundary Representation.

3. The method of claim 1 wherein any Boolean operations that use rendering facets of the geometric objects to create new geometric objects, including combination, intersection, exclusion, difference, and division, map rendering facets to extended triangles, build intersection lines, split each triangle through which an intersection line passes, check each triangle whether it is obscure or visible, regroup facets to form new extended triangle sets, and map extended triangles to rendering facets at the end of a Boolean operation or surface trimming with the data structure Constructive Solid Geometry or Boundary Representation.

4. The method of claim 1 wherein building intersection lines uses the minimum bounding boxes to detect whether two facets do not overlap and carries out edge-triangle intersection calculations comprising the steps ensuring that the intersection points are exact and the intersection lines are not approximate curves: building the formula $p=p_i+t*(p_{(i+1)\%3}-p_i)$ for expressing the i-th edge of the triangle $T_a$ that is one triangle inside the triangle pair, building the formula $ax+by+cz+d=0$ for recording the plane defined by the triangle $T_b$ that is another triangle inside the triangle pair, and getting the solution of the two linear formulas.

5. The method of claim 1 wherein searching for the first pair of triangles and searching neighboring triangles calculate edge-triangle intersection and employee neighboring triangles ensuring that direct calculation of edge-edge intersection is replaced by verifying whether a point is on an edge of a triangle.

6. The method of claim 1 wherein splitting each triangle and builds Delaunay 2D mesh with modified Watson method that defines a triangle set, a deleted triangle set, and a polygon, dividing the triangle into different partitions even when the sub-intersection lines are not convex, comprising of: building an outline point sequence that links sub-intersection lines and vertices of the triangle where applicable; mapping the three (3) dimensional point sequence to two (2) dimensional points according to the aspect of the plane defined by the triangle; adding four (4) points to form a bigger bounding box that encloses all the two (2) dimensional points; assuming that one dialog line of the bounding box splits the box into two (2) triangles and adding them into the triangle set; inserting every point except bounding ones into the triangle set with the steps: for each point, checking every triangle in the triangle set whether its circumcircle contains the point or the last segment passes through the triangle, and when the condition is met, erasing it from the triangle set and adding it to the deleted triangle set, using the deleted triangle set to extend the polygon and clearing the deleted triangle set immediately, and using the polygon to generate triangles and adding them to the triangle set; and deleting boundary triangles from the triangle set; mapping the triangle set to three dimensional triangles and adding them to BIOpTriangleSet.

7. The method of claim 1 wherein checking each triangle whether it is obscure or visible further composing: calculating the centroid c of triangle $T_a$ that belongs to geometric object A; building a line l: $p=c+t*N$ passing through the centroid c and along the normal of $T_a$; for each triangle $T_b$ of object B, checking whether l intersects with $T_b$ at an interior point and adding t to a depth buffer, t-Buffer; and setting $T_a$ to be obscure when the size of negative t equals to that of positive t in t-Buffer.

8. The method of claim 1 wherein the checking each triangle whether it is obscure or visible when trimming a surface patch with a trimming contour further composing: setting m_ID of regular points of BIOpTriangleSet of the concerned patch to be 0 and m_ID of points of the intersection lines of the said patch in ascending or descending order, which is depending on whether the said line and the trimming contour are in the same direction; according to m_ID of the member m_Points of each triangle, deciding whether it is a boundary triangle; for each boundary triangle, determining it is to the left or right side of the trimming contour, and setting its neighbors that are not boundary ones to be left or right.

9. The method of claim 1 wherein a Boolean operation that is a combination, an intersection, an exclusion, a difference, or a division, regroups facets for constructing its operational result using one or more steps of: deleting obscure or visible triangles of an object, copying obvious triangles of an object to a buffer or copying triangles from a buffer to an object, reversing the normal of each triangle of an object, and merging the triangles of the objects to form new extended triangle sets.

10. The method of claim 1 wherein the extended triangles are directly mapped to rendering facets for being displayed and providing data to next Boolean operations.

11. A computer system consisting of hardware and software that performs immediate Boolean operations using rendering facets of geometric objects, the system comprising:
a computer with input devices for entering data and commands, and a display device showing user interface, geometric objects, and additional data, having a medium storing geometric data and instructions that make up of a software system, or having a microchip or integrated circuit embedding partially or totally the instructions, and a processor that executes the steps of:
creating, modifying or loading primary geometric objects including swept and extruded ones and relocating them at different positions or orientations with input devices of the computer;
selecting two of the geometric objects;
mapping rendering facets to extended triangles that contain neighbors;
building intersection lines starting with and ending with searching for the first pair of triangles that hold a start point of an intersection line by detecting whether two minimum bounding boxes overlap and by performing edge-triangle intersection calculations for locating an intersection point, then searching neighboring triangles of the last triangle pair that holds the last intersection point to extend the intersection line until the first intersection point is identical to the last intersection point of the intersection line ensuring that the intersection line gets closed or until all triangles are traversed;
splitting each triangle through which an intersection line passes using modified Watson method, wherein the modified Watson method includes removing duplicate intersection points, identifying positions of end intersection points, and splitting portion of each triangle including an upper portion, a lower portion, and a middle portion;
checking each triangle whether it is obscure or visible for Boolean operations or for surface trimming;
regrouping facets in separate steps that includes copying triangles, deleting triangles, reversing the normal of each triangle of a geometric object, and merging reserved triangles to form one or more new extended triangle sets; and
mapping extended triangles to rendering facets.

12. The system of claim 11 wherein any Boolean operations that use rendering facets of the geometric objects to create new geometric objects, including combination, intersection, exclusion, difference, and division, map rendering facets to extended triangles, build intersection lines, split each triangle through which an intersection line passes, check each triangle whether it is obscure or visible, regroup facets to form new extended triangle sets, and map extended triangles to rendering facets at the end of a Boolean operation or surface trimming with the data structure Constructive Solid Geometry and Boundary Representation.

13. The system of claim 11 wherein any Boolean operations that use rendering facets of the geometric objects to create new geometric objects, including combination, intersection, exclusion, difference, and division, map rendering facets to extended triangles, build intersection lines, split each triangle through which an intersection line passes, check each triangle whether it is obscure or visible, regroup facets to form new extended triangle sets, and map extended triangles to rendering facets at the end of a Boolean operation or surface trimming with the data structure Constructive Solid Geometry or Boundary Representation.

14. The system of claim 11 wherein searching for the first pair of triangles that hold a start point of an intersection line and searching neighboring triangles of the last triangle pair that hold the last intersection point composed the procedure for building an intersection line that usually repeats more than one time when building intersection lines use the minimum bounding boxes to detect whether two facets do not overlap and carries out edge-triangle intersection calculations comprising the steps ensuring that the intersection points are exact and the intersection lines are not approximate curves: building the formulae $p=p_i+t*(p_{(i+1)\%3}-p_i)$ for expressing the i-th edge of the triangle $T_a$ that is one triangle inside the triangle pair, building the formula $ax+by+cz+d=0$ for recording the plane defined by the triangle $T_b$ that is another triangle inside the triangle pair, and getting the solution of the two linear formulas.

15. The system of claim 11 wherein searching for the first pair of triangles and searching neighboring triangles calculate edge-triangle intersection and employee neighboring triangles ensuring that direct calculation of edge-edge intersection is replaced by verifying whether a point is on an edge of a triangle.

16. The system of claim 11 wherein splitting each triangle builds Delaunay 2D mesh with modified Watson method that defines a triangle set, a deleted triangle set, and a polygon, dividing the triangle into different partitions even when the sub-intersection lines are not convex, comprising of: building an outline point sequence that links sub-intersection lines and vertices of the triangle where applicable; mapping the three (3) dimensional point sequence to two (2) dimensional points according to the aspect of the plane defined by the triangle; adding four (4) points to form a bigger bounding box that encloses all the two (2) dimensional points; assuming that one dialog line of the bounding box splits the box into two (2) triangles and adding them into the triangle set; inserting every point except bounding ones into the triangle set with the steps: for each point, checking every triangle in the triangle set whether its circumcircle contains the point or the last segment passes through the triangle, and when the condition is met, erasing it from the triangle set and adding it to the deleted triangle set, using the deleted triangle set to extend the polygon and clearing the deleted triangle set immediately, and using the polygon to generate triangles and add them to the triangle set; and deleting boundary triangles from the triangle set; mapping the triangle set to three dimensional triangles and adding them to BIOpTriangleSet.

17. The system of claim 11 wherein checking each triangle whether it is obscure or visible further composing: calculating the centroid c of triangle $T_a$ that belongs to geometric object A; building a line l: $p=c+t*N$ passing through the centroid c and along the normal of $T_a$; for each triangle $T_b$ of object B, checking whether l intersects with $T_b$ at an interior point and adding t to a depth buffer, t-Buffer; and setting $T_a$ to be obscure when the size of negative t equals to that of positive t in t-Buffer.

18. The system of claim 11 wherein checking each triangle whether it is obscure or visible when trimming a surface patch with a trimming contour further composing: setting m_ID of regular points of BIOpTriangleSet of the concerned patch to be 0 and m_ID of points of the intersection lines of the said patch in ascending or descending order, which is depending on whether the said line and the trimming contour are in the same direction; according to m_ID of the member m_Points of each triangle, deciding whether it is a boundary triangle; for each boundary triangle, determining it is to the left or right side of the trimming contour, and setting its neighbors that are not boundary ones to be left or right.

19. The system of claim 11 wherein a Boolean operation that is a combination, an intersection, an exclusion, a difference, or a division, regroups facets for constructing its operational result using one or more steps of: deleting obscure or visible triangles of an object, copying obscure triangles of an object to a buffer or copying triangles from a buffer to an object, reversing the normal of each triangle of an object, and merging the triangles of the objects to form new extended triangle sets.

20. The system of claim 11 wherein the extended triangles are directly mapped to rendering facets for being displayed and providing data to next Boolean operations.

* * * * *